(12) United States Patent
Minamio et al.

(10) Patent No.: US 8,125,041 B2
(45) Date of Patent: Feb. 28, 2012

(54) SEMICONDUCTOR DEVICE

(75) Inventors: Masanori Minamio, Osaka (JP); Kyoko Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 228 days.

(21) Appl. No.: 12/711,660

(22) Filed: Feb. 24, 2010

(65) Prior Publication Data

US 2010/0148292 A1    Jun. 17, 2010

Related U.S. Application Data

(63) Continuation of application No. PCT/JP2009/004099, filed on Aug. 25, 2009.

(30) Foreign Application Priority Data

Nov. 7, 2008    (JP) .................................. 2008-286893

(51) Int. Cl.
H01L 27/14    (2006.01)
(52) U.S. Cl. ........ 257/431; 257/432; 257/774; 257/775; 257/E21.63; 257/E21.644; 257/225; 257/233; 257/290; 257/291
(58) Field of Classification Search ............ 257/20–294, 257/432, 774, 775, E21.63, E21.644, E29.112, 257/E23.152, E23.175, E21.577, E21.578, 257/E21.585
See application file for complete search history.

(56) References Cited

U.S. PATENT DOCUMENTS

| | | | |
|---|---|---|---|
| 5,949,128 A * | 9/1999 | Shibib | 257/565 |
| 6,563,079 B1 | 5/2003 | Umetsu et al. | |
| 7,282,444 B2 * | 10/2007 | Tanida et al. | 438/667 |
| 7,727,794 B2 * | 6/2010 | Shibayama | 438/78 |
| 7,750,478 B2 * | 7/2010 | Kameyama et al. | 257/774 |
| 7,791,159 B2 * | 9/2010 | Kuriyama | 257/443 |
| 8,013,350 B2 * | 9/2011 | Itoi et al. | 257/98 |
| 2004/0061238 A1 | 4/2004 | Sekine | |
| 2005/0205997 A1 * | 9/2005 | Yamamoto et al. | 257/751 |
| 2006/0097357 A1 * | 5/2006 | Nemoto | 257/621 |
| 2007/0052067 A1 | 3/2007 | Umemoto | |
| 2007/0181792 A1 | 8/2007 | Yoshimoto et al. | |
| 2008/0042227 A1 * | 2/2008 | Asano et al. | 257/432 |
| 2008/0303107 A1 * | 12/2008 | Minamio et al. | 257/432 |

FOREIGN PATENT DOCUMENTS

JP    2006-041450    2/2006

\* cited by examiner

*Primary Examiner* — Kenneth Parker
*Assistant Examiner* — Jose R Diaz
(74) *Attorney, Agent, or Firm* — McDermott Will & Emery LLP

(57) ABSTRACT

A semiconductor device includes: a semiconductor substrate 1; a through electrode 7 extending through the semiconductor substrate 1; a diffusion layer 24 formed in a region of an upper portion of the semiconductor substrate 1 located on a side of the through electrode 7; and a diffusion layer 22 formed in an upper portion of the diffusion layer 24. A portion of the side surface of the through electrode 7 facing the diffusion layer 24 is curved, and a portion of the surface of the diffusion layer 24 facing the through electrode 7 is curved.

3 Claims, 3 Drawing Sheets

SEMICONDUCTOR DEVICE

CROSS-REFERENCE TO RELATED APPLICATION

This is a continuation of PCT International Application PCT/JP2009/004099 filed on Aug. 25, 2009, which claims priority to Japanese Patent Application No. 2008-286893 filed on Nov. 7, 2008. The disclosures of these applications including the specifications, the drawings, and the claims are hereby incorporated by reference in its entirety.

BACKGROUND

The technology disclosed herein relates to semiconductor devices and electronic equipment using the same.

Semiconductor devices used in various types of electronic equipment generally have a configuration including: a semiconductor substrate; an impurity diffusion layer formed in an upper portion of the semiconductor substrate near one of its principal planes (top surface); and a through electrode filled in a through hole extending from one principal plane of the semiconductor substrate through the other principal plane thereof (bottom surface). In a portion near the top surface of the semiconductor substrate, formed are a low-resistance first diffusion layer containing impurities at high concentration and a second diffusion layer containing impurities at low concentration surrounding the first diffusion layer to isolate the first diffusion layer from the semiconductor substrate. The through electrode, having a conductor formed in the through hole, is electrically connected to a connection electrode formed on the top surface of the semiconductor substrate. The through electrode is also electrically connected to an external connection terminal formed on the bottom surface of the semiconductor substrate. An insulating film is formed on the wall of the through hole to cover the side surface of the through electrode (see Japanese Patent Publication No. P2006-41450, for example).

SUMMARY

The conventional semiconductor devices described above have a problem as follows. In a region of an upper portion of the semiconductor substrate near the through electrode, a leakage current may occur between the second diffusion layer that has a potential difference against the through electrode and the conductor of the through electrode located near the second diffusion layer. As a result, the current carrying efficiency may be degraded.

Specifically, the present inventors independently found the following. In a region of an upper portion of the semiconductor substrate near the through electrode, although the insulating film exists between the second diffusion layer that has a potential difference against the through electrode and the conductor of the through electrode near the second diffusion layer, even a potential difference as small as about 5V, for example, between the conductor and the second diffusion layer will be greatly influential since the distance between the second diffusion layer and the conductor of the through electrode is extremely infinitesimal, possibly causing occurrence of a leakage current.

According to illustrative embodiments of the present invention, a leakage current between a diffusion layer and a through electrode closely opposed to each other can be reduced, and the current carrying efficiency can be improved.

The first semiconductor device of an example of the present invention includes: a semiconductor substrate through which a through hole extending from the top surface through the bottom surface is formed; a through electrode filled in the through hole to extend through the semiconductor substrate; an insulating film formed on the inner wall of the through hole to surround the side surface of the through electrode; a first diffusion layer containing impurities formed in a region of an upper portion of the semiconductor substrate located on a side of the through electrode; a second diffusion layer formed to cover the first diffusion layer, the second diffusion layer containing impurities at a lower concentration and hence being higher in electric resistance than the first diffusion layer; and a connection electrode formed on the top surface of the semiconductor substrate to be connected to the through electrode, wherein a portion of the side surface of the through electrode facing the second diffusion layer is curved toward the inside of the through hole.

With the above configuration, in which the side surface of the through electrode is curved toward the inside of the through hole, the distance between the through electrode and the second diffusion layer can be made longer compared with the case when the side surface is not curved. Hence, since the electric field between the through electrode and the second diffusion layer can be reduced, the withstand voltage increases. Accordingly, flowing of a leakage current between the through electrode and the semiconductor layer can be reduced even if the distance between the through electrode and the second diffusion layer is shortened, or if the insulating film is thinned, due to scaling down.

The second semiconductor device of an example of the present invention includes: a semiconductor substrate through which a through hole extending from the top surface through the bottom surface is formed; a through electrode filled in the through hole to extend through the semiconductor substrate; an insulating film formed on the inner wall of the through hole to surround the side surface of the through electrode; a first diffusion layer containing impurities formed in a region of an upper portion of the semiconductor substrate located on a side of the through electrode; a second diffusion layer formed to cover the first diffusion layer, the second diffusion layer containing impurities at a lower concentration and hence being higher in electric resistance than the first diffusion layer; and a connection electrode formed on the top surface of the semiconductor substrate to be connected to the through electrode, wherein a portion of the surface of the second diffusion layer facing the through electrode is curved.

With the above configuration, in which the portion of the second diffusion layer facing the through electrode is curved, the electric field concentration can be reduced compared with the case when the portion is not curved. Hence, occurrence of a tunnel current due to electric field concentration can be reduced. Accordingly, flowing of a leakage current between the through electrode and the semiconductor layer can be reduced even if the distance between the through electrode and the second diffusion layer is shortened, or if the insulating film is thinned, due to scaling down.

As described above, in the first semiconductor device of an example of the present invention, in which the surface of the through electrode facing the impurity diffusion layer is curved, the distance between the through electrode and the nearby impurity diffusion layer is made long. Hence, occurrence of a leakage current between the semiconductor layer and the through electrode can be reduced, and this can improve the current carrying efficiency.

In the second semiconductor device of an example of the present invention, in which the surface of the impurity diffusion layer facing the through electrode is curved, occurrence of a tunnel current due to electric field concentration can be reduced. Hence, occurrence of a leakage current between the impurity diffusion layer and the through electrode can be reduced, and this can improve the current carrying efficiency and prevent increase in power consumption.

DETAILED DESCRIPTION

A solid-state imaging device for electronic equipment such as a digital camera will be described, as an example of a semiconductor device of an embodiment of the present invention, with reference to the accompanying drawings.

Figure 1:
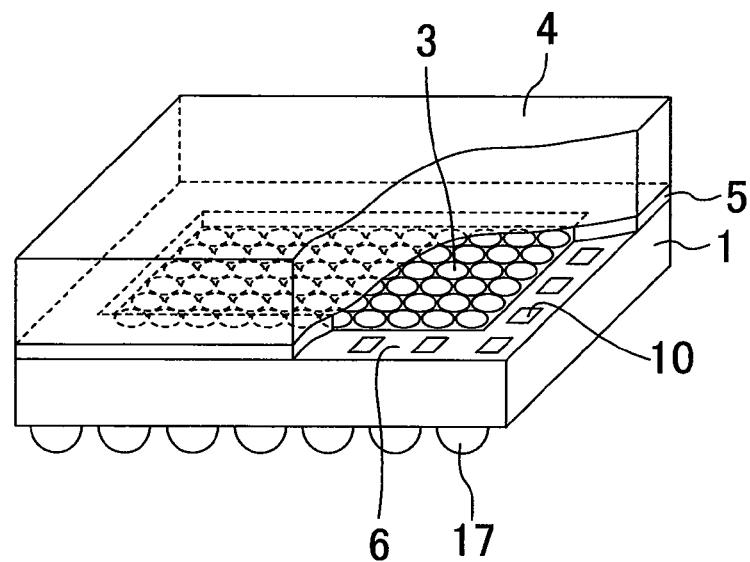
FIG. 1 is a perspective view of a solid-state imaging device of an embodiment of the present invention.
Figure 2:
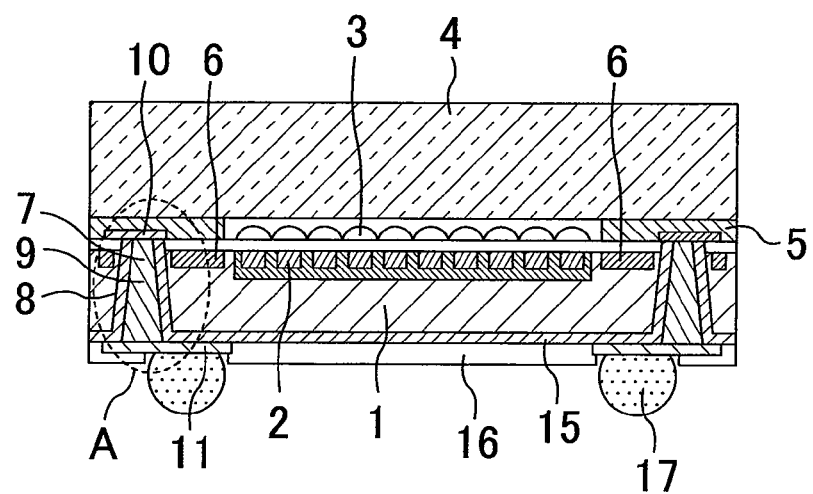
FIG. 2 is a cross-sectional view of the solid-state imaging device of the embodiment of the present invention.

FIG. 1 is a perspective view of a solid-state imaging device of an embodiment of the present invention, and FIG. 2 is a cross-sectional view of the solid-state imaging device of this embodiment.

As shown in FIGS. 1 and 2, the solid-state imaging device of this embodiment includes: a p-type semiconductor substrate 1 made of silicon and the like whose external shape is rectangular in plan; an imaging region formed in a region on one of the principal planes (hereinafter referred to as the top surface) of the semiconductor substrate 1 including the center of the plane, in which a plurality of light-receiving elements (light-receiving portions) are arranged in a matrix; a peripheral circuit 6 formed on the periphery of or outside of the imaging region; microlenses provided for the respective light-receiving elements 2 at positions above the light-receiving elements 2; a glass substrate 4 bonded to the top surface of the semiconductor substrate 1 to be placed above the microlenses 3; and a bonding agent 5 applied to the region of the semiconductor substrate 1 other than the imaging region for bonding the semiconductor substrate 1 and the glass substrate 4 to each other. The peripheral circuit 6 includes circuits responsible for drive and control of the light-receiving elements 2. The light-receiving elements 2 that may be photodiodes, for example, and the peripheral circuit 6 constructed of MOS transistors and the like are fabricated by a known semiconductor process.

The solid-state imaging device of this embodiment further includes: a plurality of connection electrodes 10 formed on the top surface of the semiconductor substrate 1 at positions surrounding the peripheral circuit 6 as viewed from top; external connection terminals 11 formed on the other principal plane (hereinafter referred to as the bottom surface) of the semiconductor substrate 11; ball-shaped external connection electrodes 17 formed below the semiconductor substrate 1 to be connected to the external connection terminals 11; through electrodes 7 each filled in a through hole 8 extending through the semiconductor substrate 1 from the bottom surface of the corresponding connection electrode 10 to the top surface of the corresponding external connection terminal 11, to be connected to the connection electrode 10 and the external connection terminal 11; a first insulating film 12 formed on the inner wall of each through hole 8; a second insulating film 15 formed on the bottom surface of the semiconductor substrate 1; and a third insulating film 16 formed on the bottom surface of the second insulating film 15 to cover the bottom surfaces of the external connection terminals 11 except for predetermined regions. Each through electrode 7 has a roughly cylindrical conductor 9. The first insulating film 12, shaped like a tube, surrounds the conductor 9 (through electrode 7).

Figure 3:
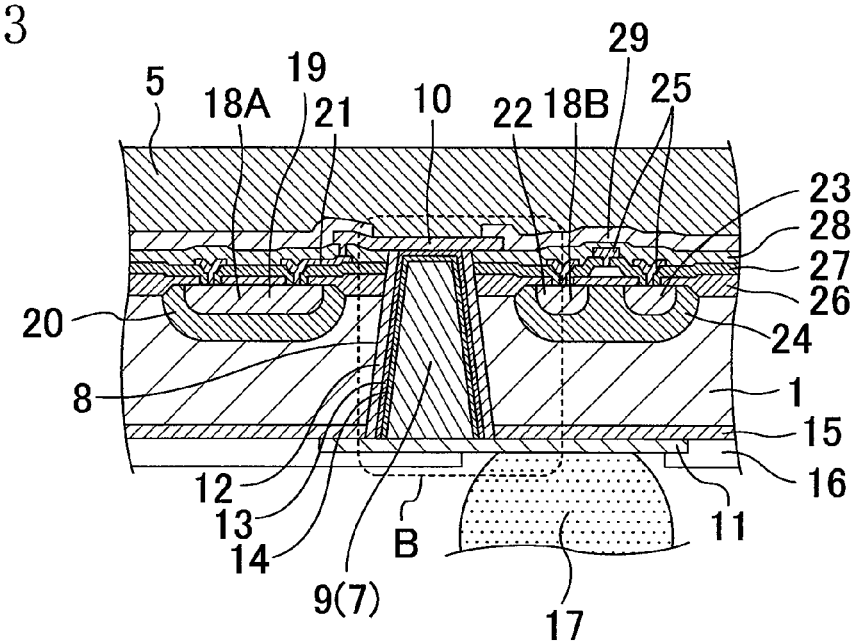
FIG. 3 is an enlarged cross-sectional view showing a configuration of part A shown in FIG. 2.
Figure 4:
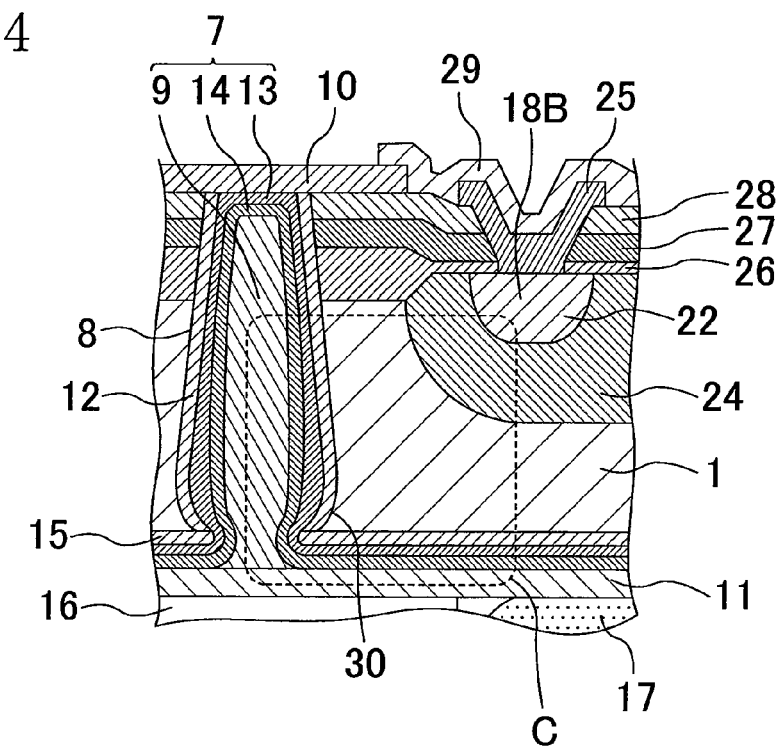
FIG. 4 is an enlarged cross-sectional view showing a configuration of part B shown in FIG. 3.
Figure 5:
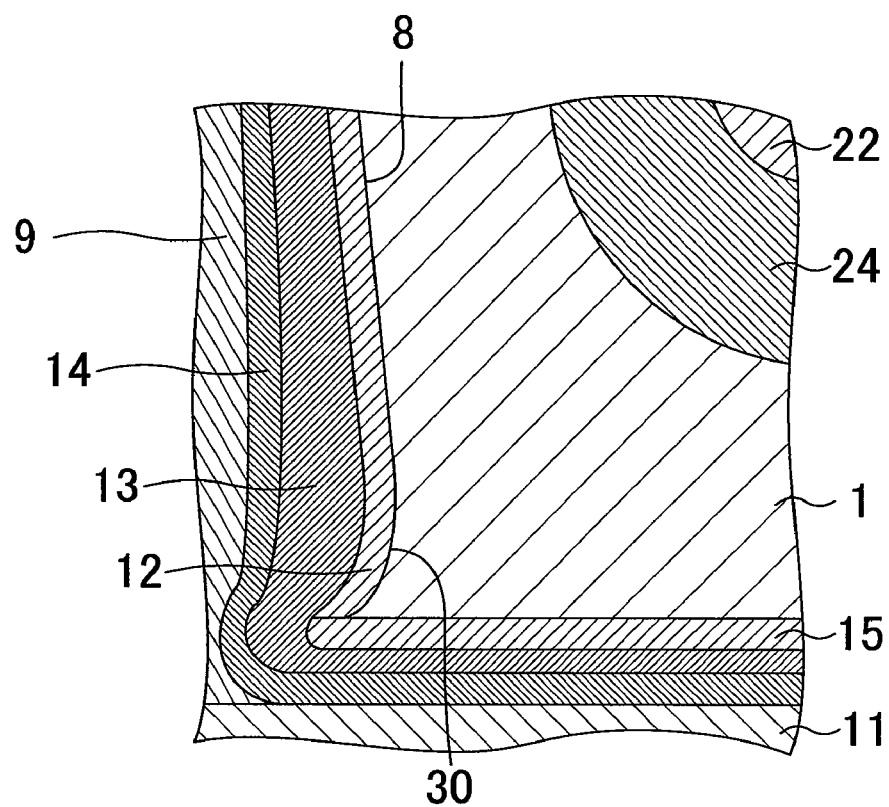
FIG. 5 is an enlarged cross-sectional view showing a configuration of part C shown in FIG. 4.

FIG. 3 is an enlarged cross-sectional view showing a configuration of part A in FIG. 2, FIG. 4 is an enlarged cross-sectional view showing a configuration of part B in FIG. 3, and FIG. 5 is an enlarged cross-sectional view showing a configuration of part C in FIG. 4.

As shown in FIGS. 3 and 4, more specifically, the through electrode 7 includes: a conductor 9 made of Cu and the like; a conductor film 14 made of Cu and the like covering the top and side surfaces of the conductor 9; and a barrier metal 13 made of Ti covering the top and side surfaces of the conductor film 14. The barrier metal 13 is provided to reduce or prevent the metal material constituting the conductor 9 from diffusing into the semiconductor substrate 1.

The peripheral circuit 6 formed on the top surface of the semiconductor substrate 1 will be described with reference to FIG. 3. FIG. 3 shows an example of configuration in which an electrostatic-discharge (ESD) protection circuit 18A on the input circuit side and a control circuit 18B for driving the light-receiving elements 2 are respectively provided on the left and right of the through electrode 7 (conductor 9). The control circuit 18B is part of the peripheral circuit 6.

The ESD protection circuit 18A includes: an n-type diffusion layer 20 containing phosphorus and the like at a concentration of about $10^{18}$ cm$^{-3}$ formed in an upper portion of the semiconductor substrate 1; a p-type diffusion layer 19 containing boron and the like at a concentration of about $10^{20}$ cm$^{-3}$ formed in an upper portion of the diffusion layer 20; and an element isolation insulating film 26 formed on the semiconductor substrate 1 including the diffusion layers 19 and 20. The element isolation insulating film 26 may be a local oxidation of silicon (LOCOS) film or a shallow trench isolation (STI) film. The diffusion layer 19 is connected to the connection electrode 10 via an interconnect 21. The diffusion layer 19 is formed by diffusing impurities that are introduced by ion implantation and the like from the top side of the semiconductor substrate 1.

In this embodiment, the diffusion layer 19 constitutes part of the circuit that protects circuit elements from static electricity. Once an overvoltage is applied, the ESD protection circuit 18A including a resistance gives rise to nondestructive discharge (punch-through) instantaneously, dropping the overvoltage to the ground potential thereby to protect the circuit elements. Hence, the ESD protection circuit 18A is placed near the head of a power supply circuit, and directly connected to the connection electrode 10 that is connected to the through electrode 7 as shown in FIG. 3.

In contrast, the control circuit 18B for driving the light-receiving elements 2 placed on the right of the through electrode 7 as viewed from FIG. 3 is not directly connected to the connection electrode 10 but connected to a circuit downstream of the ESD protection circuit 18A.

As shown in FIGS. 3 and 4, the control circuit 18B includes: a diffusion layer (second diffusion layer) 24 containing impurities of the first conductivity type formed in an upper portion of the semiconductor substrate 1; diffusion layers (first diffusion layers) 22 and 23 containing impurities of the second conductivity type formed in an upper portion of the diffusion layer 24; a gate electrode formed on the diffusion layer 24 via a gate insulating film at a position between the diffusion layers 22 and 23 as viewed from top; and the element isolation insulating film 26 formed on the semiconductor substrate 1 including the diffusion layers 22, 23, and 24. The diffusion layers 22 and 23 are higher in impurity concentration than the diffusion layer 24, and hence serve as low-resistance regions. The diffusion layers 22 and 23 are isolated from the other portion of the semiconductor substrate 1 by the diffusion layer 24.

In both the ESD protection circuit 18A and the control circuit 18B, a lower interlayer insulating film 27 and an upper interlayer insulating film 28 are formed on the element isolation insulating film 26 except for regions where interconnects 25 are formed.

In the control circuit 18B, the diffusion layers 22 and 23 constitute a MOS transistor of the control circuit 18B together with the gate electrode, and, as is found from FIGS. 3 and 4, are not directly connected to the nearby connection electrode 10 but connected to a circuit downstream of the ESD protection circuit 18A as described above. Specifically, as shown in FIG. 4, no electrical connection is made between the interconnect 25 and the connection electrode 10, but an insulating surface protection layer 29 is formed therebetween and on the interconnect 25.

For the above reason, the diffusion layer 24 that is in contact with the diffusion layers 22 and 23 and the through electrode 7 are often different in voltage value from each other (although they are in the same voltage value at some operation timing). In such a case, a potential difference will occur between the diffusion layer 24 and the barrier metal 13 of the through electrode 7.

Also, since the distance between the diffusion layer 24 and the barrier metal 13 of the through electrode 7 adjacent to each other via the semiconductor substrate 1 is as small as several micrometers, an electric field of $3 \times 10^4$ to $5 \times 10^4$ V/cm will be applied even with a potential difference of 5 V, for example. Moreover, since the first insulating film 12 is thin, a leakage current may possibly occur via a minute defect and the like of the first insulating film 12 if no measures are taken.

To address the above problem, in the solid-state imaging device of this embodiment, a portion of the side surface of the through electrode 7 (side surface of the barrier metal 13) that faces the diffusion layer 24 of the control circuit 18B adjacent to the through electrode 7 is curved, and a portion of the surface of the diffusion layer 24 facing the through electrode 7 is also curved. In other words, the portion of the through electrode 7 facing the diffusion layer 24 is curved not only in the direction horizontal to the substrate plane (horizontal direction) with a given curvature but also in the vertical direction with a given curvature as shown in FIG. 4. Also, a portion of the inner wall of the through hole 8 facing the diffusion layer 24 is curved to suit to the through electrode 7.

With the configuration described above, the distance between the portion of the through electrode 7 facing the semiconductor layer (diffusion layer 24) formed adjacent to the through electrode 7 and the diffusion layer 24 can be made long compared with the conventional configuration. In addition, since the portion of the side surface of the through electrode 7 facing the diffusion layer 24 is curved, electric field concentration does not easily occur between the portion of the surface of the diffusion layer 24 facing the through electrode 7 and the portion of the side surface of the through electrode 7 (or the barrier metal 13) facing the diffusion layer 24. As a result, it is possible to reduce occurrence of a leakage current between the diffusion layer 24 and the through electrode 7 (barrier metal 13) via the first insulating film 12.

The occurrence of a leakage current between the diffusion layer 24 and the barrier metal 13 indicates that a leakage current is flowing between the diffusion layers 22, 23, and 24 and the structure of the barrier metal 13, the conductor film 14, and the conductor 9 via the first insulating film 12. In the solid-state imaging device of this embodiment, however, since the occurrence of a leakage current flowing between the through electrode 7 and the diffusion layer 24 is reduced, degradation in current carrying efficiency and occurrence of operation failure can be reduced or prevented. Hence, the reliability improves compared with the conventional solid-state imaging device.

In the solid-state imaging device of this embodiment, the portions of the surfaces of the diffusion layer 24 and the nearby through electrode 7 (barrier metal 13) facing each other are curved as shown in FIGS. 3 to 5. To attain this, the portion of the inner wall of the through hole 8 facing the diffusion layer 24 must be curved. In this embodiment, therefore, a mask for opening the bottom of the through hole 8 is formed on the bottom surface of the semiconductor substrate 1. Using this mask, the semiconductor substrate 1 is subjected to wet etching and dry etching, whereby the opening area of the through hole 8 can be made larger as the position in the through hole 8 is farther from the bottom surface of the semiconductor substrate 1 toward the top surface up to a predetermined position (e.g., a position deeper than the bottom of the diffusion layer 24). In this way, the inner wall of the through hole 8 can be curved in the vertical and horizontal directions.

Adopting the process described above, an overhang 30 is formed at a position in the through hole 8 near the bottom surface of the semiconductor substrate 1 as shown in FIG. 5. However, since the overhang 30 is covered with the first insulating film 12, the barrier metal 13, and the conductor film 14, it is free from a breakage or the like.

Note that the curved surface formed for the through hole 8 is also transferred to the first insulating film 12 and the barrier metal 13 that are formed along the inner wall of the through hole 8 in subsequent steps.

As for the diffusion layer 24, conductive impurities are introduced in a predetermined region of an upper portion of the semiconductor substrate 1 by ion implantation and the like in a manner of dividing the implantation into a plurality of times according to the depth direction, and then diffused and activated by thermal treatment. In the divided implantation according to the depth direction, the mask opening size is changed so that the opening is farther from the through hole as the depth is greater. In this way, the portion of the surface of the diffusion layer facing the through electrode 7 can be curved. By adopting this method, the curvature of the diffusion layer can be made large compared with the case of forming the diffusion layer by one-time ion implantation and thermal diffusion.

In the solid-state imaging device of this embodiment, the thickness of the semiconductor substrate 1 in which the semiconductor layer (diffusion layer 24) is formed is preferably less than 50 µm. Particularly, a thickness in the range of 5 µm to 30 µm is preferable. The reason is that, if the semiconductor substrate 1 is sufficiently thin, the overhang 30 of the through electrode 7 will be close to the diffusion layer 24. Occurrence of a leakage current will be sufficiently reduced even if the distance between the through electrode 7 and the diffusion layer 24 is as small as about 10 µm, for example.

In the solid-state imaging device of this embodiment, the semiconductor layer is not limited to the diffusion layer 24 of the control circuit 18B, but may be a semiconductor layer in which a diffusion layer formed inside is not electrically connected to the through electrode 10 or the connection electrode 10 directly. By curving the portion of the side surface of the through electrode 7 facing such a semiconductor layer, occurrence of a leakage current can be reduced effectively.

A similar configuration to that of the semiconductor layer and the through electrode 7 of the solid-state imaging device of this embodiment may be applied to a semiconductor device other than the solid-state imaging device. In this case, also, a similar effect to that described above can be obtained.

As described above, the present invention is applicable favorably to solid-state imaging devices used in imaging apparatuses such as cameras and to other semiconductor devices used in various types of electronic equipment.

What is claimed is:

1. A semiconductor device, comprising:
   a semiconductor substrate through which a through hole extending from the top surface through the bottom surface is formed;
   a through electrode filled in the through hole to extend through the semiconductor substrate;
   an insulating film formed on the inner wall of the through hole to surround the side surface of the through electrode;
   a first diffusion layer containing impurities formed in a region of an upper portion of the semiconductor substrate located on a side of the through electrode;
   a second diffusion layer formed to cover the first diffusion layer, the second diffusion layer containing impurities at a lower concentration and hence being higher in electric resistance than the first diffusion layer; and
   a connection electrode formed on the top surface of the semiconductor substrate to be connected to the through electrode,
   wherein
   a portion of the side surface of the through electrode facing the second diffusion layer is curved toward the inside of the through hole,
   an imaging region in which a plurality of light-receiving portions are arranged is formed on the top surface of the semiconductor substrate,
   a peripheral circuit is formed on the top surface of the semiconductor substrate in a region outside of the imaging region, and
   the first diffusion layer and the second diffusion layer constitute part of the peripheral circuit.

2. The semiconductor device of claim 1, wherein
   a potential difference occurs between the second diffusion layer and the through electrode during operation.

3. The semiconductor device of claim 1, wherein
   the opening area of the through hole is larger as the position in the through hole is farther from the bottom surface of the semiconductor substrate toward the top surface up to a predetermined position, whereby the inner wall of the through hole is curved.

* * * * *